United States Patent
Sameshima et al.

(10) Patent No.: US 10,954,593 B2
(45) Date of Patent: Mar. 23, 2021

(54) TUNGSTEN FILM-FORMING METHOD, FILM-FORMING SYSTEM AND STORAGE MEDIUM

(71) Applicant: TOKYO ELECTRON LIMITED, Tokyo (JP)

(72) Inventors: Takashi Sameshima, Nirasaki (JP); Koji Maekawa, Nirasaki (JP); Katsumasa Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/276,867

(22) Filed: Feb. 15, 2019

(65) Prior Publication Data

US 2019/0256972 A1  Aug. 22, 2019

(30) Foreign Application Priority Data

Feb. 21, 2018  (JP) ............... JP2018-029006

(51) Int. Cl.
| | |
|---|---|
| C23C 16/14 | (2006.01) |
| C23C 16/24 | (2006.01) |
| H01L 21/285 | (2006.01) |
| H01L 21/768 | (2006.01) |
| C23C 16/455 | (2006.01) |
| C23C 16/02 | (2006.01) |
| C23C 16/52 | (2006.01) |

(52) U.S. Cl.
CPC .......... *C23C 16/14* (2013.01); *C23C 16/0281* (2013.01); *C23C 16/24* (2013.01); *C23C 16/45525* (2013.01); *C23C 16/52* (2013.01); *H01L 21/28568* (2013.01); *H01L 21/76876* (2013.01)

(58) Field of Classification Search
CPC ................ C23C 16/14; C23C 16/52
See application file for complete search history.

(56) References Cited

U.S. PATENT DOCUMENTS

| | | | |
|---|---|---|---|
| 2009/0143890 A1* | 6/2009 | Morisawa | C23C 16/4405 700/108 |
| 2017/0117155 A1* | 4/2017 | Bamnolker | C23C 16/45523 |
| 2017/0345576 A1* | 11/2017 | Tsuyoshi | H01G 4/33 |
| 2018/0247821 A1* | 8/2018 | Chen | H01L 21/76877 |

FOREIGN PATENT DOCUMENTS

| | | |
|---|---|---|
| JP | 10-32248 A | 2/1998 |
| JP | 2013213274 A | 10/2013 |
| KR | 1020130035913 A | 4/2013 |
| KR | 1020150128615 A | 11/2015 |

* cited by examiner

*Primary Examiner* — Farun Lu

(74) *Attorney, Agent, or Firm* — Nath, Goldberg & Meyer; Jerald L. Meyer

(57) ABSTRACT

There is provided a tungsten film-forming method, including: forming a silicon film on a substrate in a reduced pressure atmosphere by disposing the substrate having a protective film formed on a surface of the substrate in a processing container; forming an initial tungsten film by supplying a tungsten chloride gas to the substrate having the silicon film formed thereon; and forming a main tungsten film by supplying a tungsten-containing gas to the substrate having the initial tungsten film formed thereon.

9 Claims, 10 Drawing Sheets

| | Step S11 | Step S12 | Step S13 | Step S14 |
|---|---|---|---|---|
| SiH$_4$ gas (Gas supply line 51b) | → | | | |
| N$_2$ gas (Gas supply line 53b) | | | | → |
| N$_2$ gas (Gas supply line 52b) | | → | | → |
| B$_2$H$_6$ gas (Gas supply line 55b) | | | → | |
| N$_2$ gas (Gas supply line 56b) | | → | | → |
| N$_2$ gas (Gas supply line 57b) | | | | → |

Repeated

TUNGSTEN FILM-FORMING METHOD, FILM-FORMING SYSTEM AND STORAGE MEDIUM

CROSS-REFERENCE TO RELATED APPLICATION

This application is based upon and claims the benefit of priority from Japanese Patent Application No. 2018-029006, filed on Feb. 21, 2018, the entire contents of which are incorporated herein by reference.

TECHNICAL FIELD

The present disclosure relates to a tungsten film-forming method, a film-forming system and a storage medium.

BACKGROUND

In LSI, tungsten is widely used for parts requiring a heat resistance, such as a MOSFET gate electrode, a contact with a source/drain, a word line of a memory and the like. In recent years, a chemical vapor deposition (CVD) method with good step coverage is used for a deposition process of tungsten.

In the related art, when forming a tungsten film by the CVD method, from the viewpoint of adhesion to a silicon layer and suppression of a reaction, there has been used a method in which a TiN film is formed as a barrier layer on a silicon layer and a tungsten film is formed on the TiN film. Furthermore, in the related art, a nucleation process for facilitating uniform tungsten film formation is performed prior to main film formation of the tungsten film by the above reaction.

SUMMARY

Some embodiments of the present disclosure provide a technique capable of reducing the resistance of a tungsten film.

According to one embodiment of the present disclosure, there is provided a tungsten film-forming method, including: forming a silicon film on a substrate in a reduced pressure atmosphere by disposing the substrate having a protective film formed on a surface of the substrate in a processing container; forming an initial tungsten film by supplying a tungsten chloride gas to the substrate having the silicon film formed thereon; and forming a main tungsten film by supplying a tungsten-containing gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
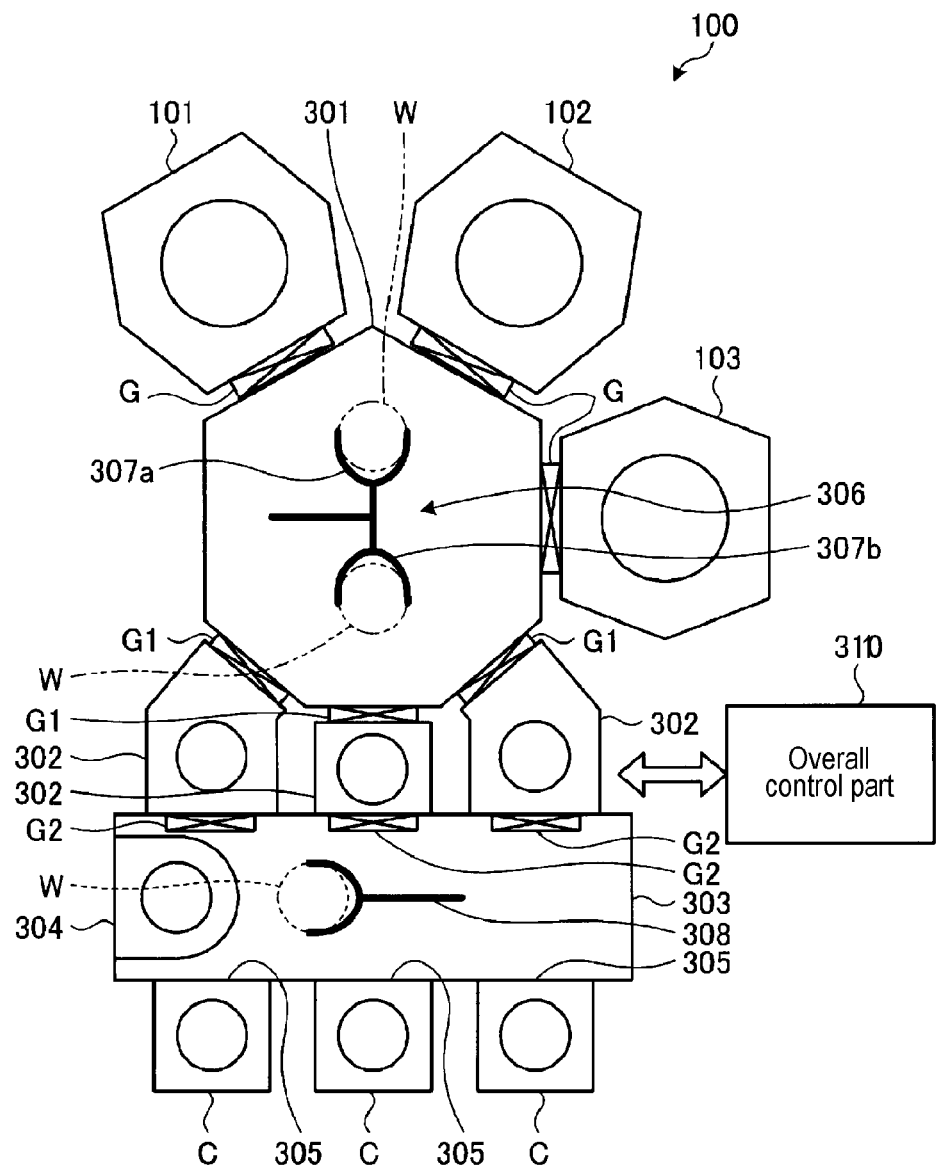
FIG. 1 is a diagram showing an example of a schematic overall configuration of a film-forming system according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a tungsten film-forming method and a film-forming system of the present disclosure will be described in detail with reference to the drawings. In the drawings, the same or corresponding parts are designated by like reference numerals. In addition, the technique disclosed herein is not limited by the embodiments.

[System Configuration]

In the present embodiment, a case where film formation is performed by a film-forming system including a plurality of film-forming apparatuses will be described as an example. First, a film-forming system according to the present embodiment will be described. FIG. 1 is a diagram showing an example of a schematic overall configuration of a film-forming system according to an embodiment. The film-forming system 100 is configured to form a tungsten film by forming a silicon film on a substrate having a protective film, for example, an AlO film formed on a surface thereof, replacing the silicon film to form an initial tungsten film, and forming a main tungsten film on the initial tungsten film. In the present embodiment, a case where the substrate is a silicon wafer will be described by way of example.

As shown in FIG. 1, the film-forming system 100 includes one first film-forming apparatus 101 for forming a silicon film, one second film-forming apparatus 102 for forming an initial tungsten film, and one third film-forming apparatus 103 for forming a main tungsten film. The first film-forming apparatus 101, the second film-forming apparatus 102 and the third film-forming apparatus 103 are connected to three wall portions of a vacuum transfer chamber 301 having a heptagonal shape in a plan view via gate valves G, respectively. The inside of the vacuum transfer chamber 301 is evacuated by a vacuum pump and kept at a predetermined degree of vacuum. In other words, the film-forming system 100 is a multi-chamber type vacuum processing system, in which a tungsten film can be continuously formed without breaking the vacuum. That is, all of the processes performed in the processing containers of the first film-forming apparatus 101, the second film-forming apparatus 102, and the third film-forming apparatus 103 are performed without exposing a silicon wafer W (hereinafter referred to as "wafer W") to the air.

The configurations of the first film-forming apparatus 101 and the second film-forming apparatus 102 will be described later. The third film-forming apparatus 103 is, for example, an apparatus that forms a tungsten film (W) by alternately or simultaneously supplying, for example, a tungsten-containing gas and a hydrogen-containing gas onto the wafer W by ALD (Atomic Layer Deposition) or CVD (Chemical Vapor Deposition) in a vacuum atmosphere chamber. The tungsten-containing gas is, for example, a $WF_6$ gas, and the hydrogen-containing gas is, for example, a $H_2$ gas.

Three load lock chambers 302 are connected to the remaining three wall portions of the vacuum transfer chamber 301 via gate valves G1. At the opposite side of the vacuum transfer chamber 301 across the load lock chambers 302, an atmospheric transfer chamber 303 is provided. The three load lock chambers 302 are connected to the atmospheric transfer chamber 303 via the gate valves G2. The load lock chambers 302 control a pressure between the atmospheric pressure and the vacuum when the wafer W is transferred between the atmospheric transfer chamber 303 and the vacuum transfer chamber 301.

Three carrier attachment ports 305 to which carriers (FOUPs or the like) C for accommodating wafers W are attached are provided on the wall portion of the atmospheric transfer chamber 303 opposite to the wall portion to which the load lock chambers 302 are attached. An alignment chamber 304 for aligning the wafer W is provided on a sidewall of the atmospheric transfer chamber 303. A downflow of clean air is formed in the atmospheric transfer chamber 303.

Inside the vacuum transfer chamber 301, a transfer mechanism 306 is provided. The transfer mechanism 306 transfers the wafer W to the first film-forming apparatus 101, the second film-forming apparatus 102 and the load lock chambers 302. The transfer mechanism 306 includes two independently-movable transfer arms 307a and 307b.

Inside the atmospheric transfer chamber 303, a transfer mechanism 308 is provided. The transfer mechanism 308 is configured to transfer the wafer W to the carriers C, the load lock chambers 302 and the alignment chamber 304.

The film-forming system 100 includes an overall control part 310. The overall control part 310 includes a main control part such as a CPU (computer) or the like, an input device (a keyboard, a mouse, etc.), an output device (a printer, etc.), a display device (display, etc.), and a storage device (storage medium). The main control part controls the respective constituent parts of the first film-forming apparatus 101 and the respective constituent parts of the second film-forming apparatus 102. Further, the main control part controls an exhaust mechanism, a gas supply mechanism and a transfer mechanism 306 of the vacuum transfer chamber 301, an exhaust mechanism and a gas supply mechanism of the load lock chamber 302, a transfer mechanism 308 of the atmospheric transfer chamber 303, a driving system of the gate valves G, G1 and G2, and the like. The main control part of the overall control part 310 causes the film-forming system 100 to perform a predetermined operation, for example, based on a processing recipe stored in a storage medium built in the storage device or in a storage medium set in the storage device. The overall control part 310 may be a higher-level control part of the control parts of the respective units, such as the control part 6 of the first film-forming apparatus 101 and the second film-forming apparatus 102 which will be described later.

Next, the operation of the film-forming system 100 configured as described above will be described. The following processing operation is executed based on the processing recipe stored in the storage medium in the overall control part 310.

First, the carrier C containing wafers W is attached to the carrier attachment port 305 of the atmospheric transfer chamber 303. An AlO film as a protective layer is formed on the surface of the wafer W. The transfer mechanism 308 of the atmospheric transfer chamber 303 takes out the wafer W from the carrier C and loads it into the alignment chamber 304. The alignment chamber 304 performs alignment of the wafer W. In the atmospheric transfer chamber 303, the gate valve G2 of one of the load lock chambers 302 is opened. The transfer mechanism 308 takes out the aligned wafer W from the alignment chamber 304. The transfer mechanism 308 loads the taken-out wafer W into the load lock chamber 302 from the opened gate valve G2. After loading the wafer W, the gate valve G2 of the load lock chamber 302 is closed. The load lock chamber 302 into which the wafer W has been loaded is evacuated.

When the load lock chamber 302 reaches a predetermined degree of vacuum, the gate valve G1 of the load lock chamber 302 is opened. The transfer mechanism 306 takes out the wafer W from the load lock chamber 302 by one of the transfer arms 307a and 307b.

The gate valve G of the first film-forming apparatus 101 is opened. The transfer mechanism 306 loads the wafer W held by one of the transfer arms into the first film-forming apparatus 101 and returns the empty transfer arm to the vacuum transfer chamber 301. The gate valve G of the first film-forming apparatus 101 is closed. The first film-forming apparatus 101 performs a film-forming process of a silicon film on the loaded wafer W.

After completion of the film-forming process of the silicon film, the gate valve G of the first film-forming apparatus 101 is opened. The transfer mechanism 306 unloads the wafer W from the first film-forming apparatus 101 by one of the transfer arms 307a and 307b. The gate valve G of the second film-forming apparatus 102 is opened. The transfer mechanism 306 loads the wafer W held by one of the transfer arms into the second film-forming apparatus 102 having the gate valve G opened, and returns the empty transfer arm to the vacuum transfer chamber 301. The gate valve G of the second film-forming apparatus 102 into which the wafer W has been loaded is closed. The second film-forming apparatus 102 performs a film-forming process of an initial tungsten film on the loaded wafer W.

After completion of the film-forming process of the initial tungsten film, the gate valve G of the second film-forming apparatus 102 is opened. The transfer mechanism 306 unloads the wafer W from the second film-forming apparatus 102 by one of the transfer arms 307a and 307b. The gate valve G of the third film-forming apparatus 103 is opened. The transfer mechanism 306 loads the wafer W held by one of the transfer arms into the third film-forming apparatus 103 with the gate valve G opened, and returns the empty transfer arm to the vacuum transfer chamber 301. The gate valve G of the third film-forming apparatus 103 into which the wafer W has been loaded is closed. The third film-forming apparatus 103 performs a film-forming process of a main tungsten film on the loaded wafer W.

After the main tungsten film is formed, the gate valve G of the third film-forming apparatus 103 is opened. The transfer mechanism 306 unloads the wafer W from the third film-forming apparatus 103 by one of the transfer arms 307*a* and 307*b*. The gate valve G1 of one of the load lock chambers 302 is opened. The transfer mechanism 306 loads the wafer W on the transfer arm into the load lock chamber 302. The gate valve G1 of the load lock chamber 302 into which the wafer W has been loaded is closed. The inside of the load lock chamber 302 into which the wafer W has been loaded is returned to the atmospheric pressure. The gate valve G2 of the load lock chamber 302 whose inside has been returned to the atmospheric pressure is opened. The transfer mechanism 308 takes out the wafer W in the load lock chamber 302 from the opened gate valve G2. The transfer mechanism 308 returns the taken-out wafer W to the carrier C.

The above processes are performed concurrently on a plurality of wafers W, whereby the film-forming process of the tungsten film for a predetermined number of wafers W is completed.

As described above, by constituting the film-forming system 100 with one first film-forming apparatus 101, one second film-forming apparatus 102 and one third film-forming apparatus, it is possible to realize the formation of the silicon film, the formation of the initial tungsten film and the formation of the main tungsten film with high throughput. The film-forming system 100 of the present embodiment is illustrated as a vacuum processing system equipped with three film-forming apparatuses. However, as long as a plurality of film-forming apparatuses can be mounted on a vacuum processing system, the number of film-forming apparatuses is not limited thereto. The number of film-forming apparatuses may be four or more.

[Configuration of Film-Forming Apparatus]

The first film-forming apparatus 101 and the second film-forming apparatus 102 have substantially the same configuration. Hereinafter, the configuration of the first film-forming apparatus 101 will be mainly described. As for the configuration of the second film-forming apparatus 102, different parts will be mainly described.

Figure 2:
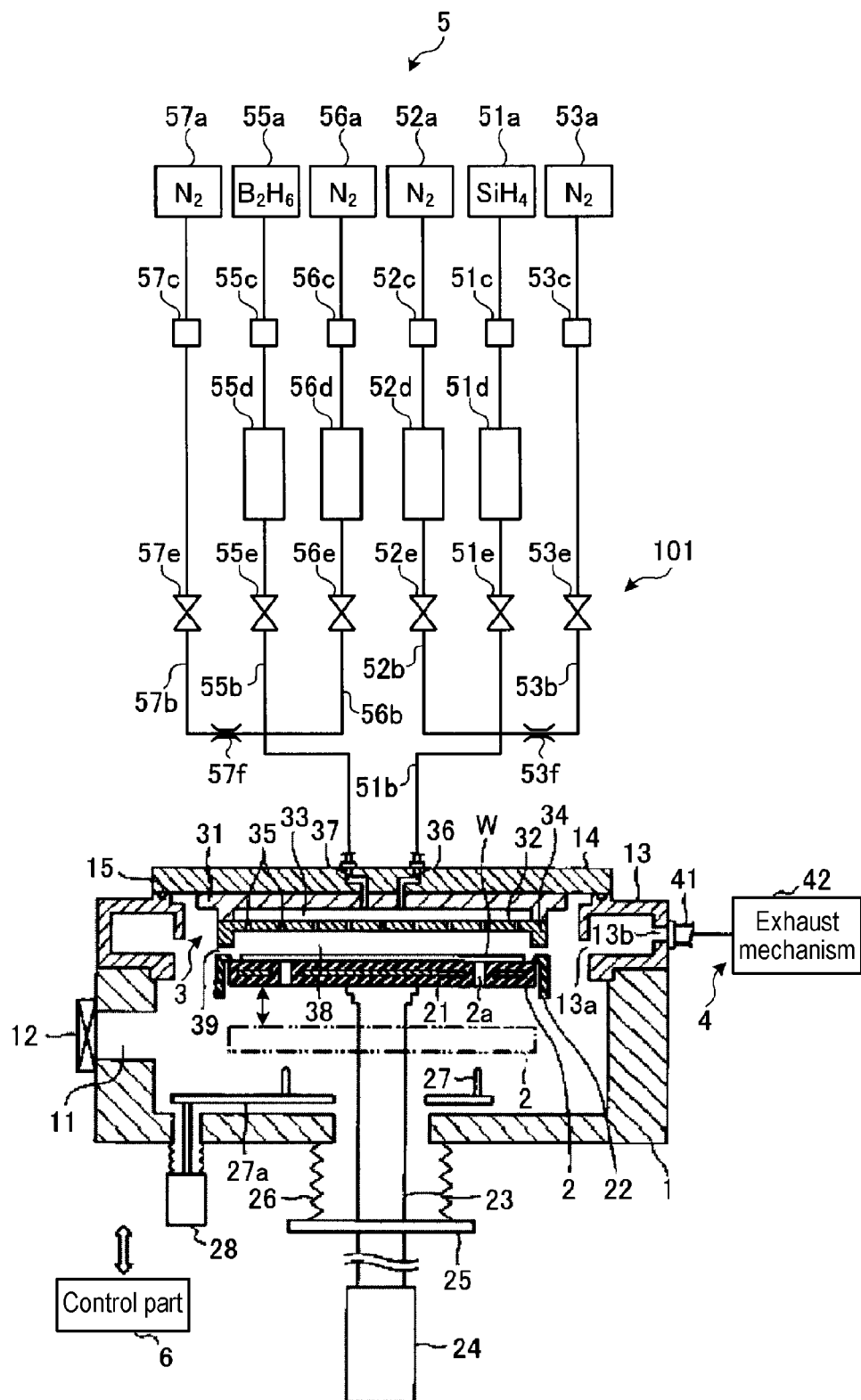
FIG. 2 is a sectional view showing an example of a schematic configuration of a first film-forming apparatus according to an embodiment of the present disclosure.

The configuration of the first film-forming apparatus 101 will be described. FIG. 2 is a sectional view showing an example of the schematic configuration of the first film-forming apparatus according to the present embodiment. The first film-forming apparatus 101 includes a processing container 1, a mounting table 2, a shower head 3, an exhaust part 4, a gas supply mechanism 5 and a control part 6.

The processing container 1 is made of a metal such as aluminum or the like and has a substantially cylindrical shape. The processing container 1 accommodates a wafer W as a substrate to be processed. A loading/unloading port 11 for loading or unloading the wafer W is formed on the side wall of the processing container 1. The loading/unloading port 11 is opened and closed by a gate valve 12. An annular exhaust duct 13 having a rectangular cross section is provided on the main body of the processing container 1. A slit 13*a* is formed in the exhaust duct 13 along the inner peripheral surface. An exhaust port 13*b* is formed in the outer wall of the exhaust duct 13. On the upper surface of the exhaust duct 13, a top wall 14 is provided so as to close the upper opening of the processing container 1. The space between the exhaust duct 13 and the top wall 14 is hermetically sealed by a seal ring 15.

The mounting table 2 horizontally supports the wafer W in the processing container 1. The mounting table 2 is formed in a disk shape having a size corresponding to the wafer W and is supported by a support member 23. The mounting table 2 is made of a ceramic material such as aluminum nitride (AlN) or the like, or a metallic material such as aluminum, nickel alloy or the like. A heater 21 for heating the wafer W is buried in the mounting table 2. The heater 21 is supplied with electric power from a heater power supply (not shown) to generate heat. Then, an output of the heater 21 is controlled by a temperature signal of a thermocouple (not shown) provided in the vicinity of the upper surface of the mounting table 2, whereby the wafer W is controlled to a predetermined temperature. In the mounting table 2, a cover member 22 formed of ceramics such as alumina or the like is provided so as to cover the outer peripheral region of the upper surface and the side surface.

On the bottom surface of the mounting table 2, a support member 23 for supporting the mounting table 2 is provided. The support member 23 extends downward from the center of the bottom surface of the mounting table 2 through a hole formed in the bottom wall of the processing container 1. The downwardly-extending lower end of the support member 23 is connected to an elevating mechanism 24. The mounting table 2 is raised and lowered via the support member 23 by the elevating mechanism 24 between a processing position shown in FIG. 2 and a transfer position located below the processing position as indicated by a two-dot chain line so that the wafer W can be transferred. A flange portion 25 is attached to the support member 23 on the lower side of the processing container 1. Between the bottom surface of the processing container 1 and the flange portion 25, there is provided a bellows 26 which isolates the atmosphere inside the processing container 1 from an external air and which expands and contracts in response to the upward/downward movement of the mounting table 2.

Three wafer support pins 27 are provided in the vicinity of the bottom surface of the processing container 1 so as to protrude upward from an elevating plate 27*a*. In FIG. 2, two of the three wafer support pins 27 are shown. The wafer support pins 27 are raised and lowered via the elevating plate 27*a* by an elevating mechanism 28 provided below the processing container 1. The wafer support pins 27 are inserted through the through holes 2*a* provided in the mounting table 2 located at the transfer position and can protrude and retract with respect to the upper surface of the mounting table 2. By moving the wafer support pins 27 up and down, the delivery of the wafer W between the transfer mechanism (not shown) and the mounting table 2 is performed.

The shower head 3 supplies a processing gas into the processing container 1 in a shower shape. The shower head 3 is made of a metal and is provided so as to face the mounting table 2. The shower head 3 has substantially the same diameter as the mounting table 2. The shower head 3 includes a main body portion 31 fixed to the top wall 14 of the processing container 1 and a shower plate 32 connected to a lower portion of the main body portion 31. A gas diffusion space 33 is formed between the main body portion 31 and the shower plate 32. In the gas diffusion space 33, gas introduction holes 36 and 37 are provided so as to penetrate the top wall 14 of the processing container 1 and the center of the main body portion 31. An annular protrusion 34 protruding downward is formed in the peripheral edge portion of the shower plate 32. Gas discharge holes 35 are formed on the inner flat surface of the annular protrusion 34. In a state in which the mounting table 2 is located at the processing position, a processing space 38 is formed between the mounting table 2 and the shower plate 32, and the upper surface of the cover member 22 and the annular protrusion 34 come close to each other to form an annular gap 39.

The exhaust part 4 evacuates the inside of the processing container 1. The exhaust part 4 includes an exhaust pipe 41 connected to the exhaust port 13b and an exhaust mechanism 42 having a vacuum pump, a pressure control valve and the like connected to the exhaust pipe 41. In a process, the gas in the processing container 1 is moved to the exhaust duct 13 via the slit 13a and is exhausted from the exhaust duct 13 through the exhaust pipe 41 by the exhaust mechanism 42.

The gas supply mechanism 5 is connected to the gas introduction holes 36 and 37 and is capable of supplying various gases used for film formation. In the present embodiment, a silicon film is formed on the wafer W by supplying a $SiH_4$ (silane) gas and a $B_2H_6$ (boron) gas from the gas supply mechanism 5. By forming the silicon film using the $SiH_4$ gas and the $B_2H_6$ gas, it is possible to improve the adhesion of the silicon film with respect to the wafer W. The gas used for forming the silicon film is not limited to the combination of the $SiH_4$ and the $B_2H_6$. For example, the gas used for forming the silicon film may be DCS or $Si_2H_6$.

For example, the gas supply mechanism 5 includes a $SiH_4$ gas supply source 51a, an $N_2$ gas supply source 52a, an $N_2$ gas supply source 53a, a $B_2H_6$ gas supply source 55a, an $N_2$ gas supply source 56a and an $N_2$ gas supply source 57a as gas supply sources for forming a silicon film. In the gas supply mechanism 5 shown in FIG. 2, the respective gas supply sources are shown separately. However, the gas supply sources capable of being used in common may be used in common.

The $SiH_4$ gas supply source 51a supplies a $SiH_4$ gas into the processing container 1 via a gas supply line 51b. In the gas supply line 51b, a flow rate controller 51c, a storage tank 51d and a valve 51e are installed sequentially from the upstream side. On the downstream side of the valve 51e, the gas supply line 51b is connected to the gas introduction hole 36. The $SiH_4$ gas supplied from the $SiH_4$ gas supply source 51a is temporarily stored in the storage tank 51d before being supplied into the processing container 1, pressurized to a predetermined pressure in the storage tank 51d, and then supplied to the processing container 1. The supply and cutoff of the $SiH_4$ gas to be supplied from the storage tank 51d to the processing container 1 is performed by the valve 51e. By temporarily storing the $SiH_4$ gas in the storage tank 51d in this manner, the $SiH_4$ gas can be stably supplied into the processing container 1 at a relatively large flow rate.

The $N_2$ gas supply source 52a supplies an $N_2$ gas as a carrier gas into the processing container 1 via a gas supply line 52b. In the gas supply line 52b, a flow rate controller 52c, a storage tank 52d and a valve 52e are installed sequentially from the upstream side. On the downstream side of the valve 52e, the gas supply line 52b is connected to the gas supply line 51b. The $N_2$ gas supplied from the $N_2$ gas supply source 52a is temporarily stored in the storage tank 52d before being supplied into the processing container 1, pressurized to a predetermined pressure in the storage tank 52d, and then supplied into the processing container 1. The supply and cutoff of the $N_2$ to be supplied from the storage tank 52d to the processing container 1 is performed by the valve 52e. By temporarily storing the $N_2$ gas in the storage tank 52d in this manner, the $N_2$ gas can be stably supplied into the processing container 1 at a relatively large flow rate.

The $N_2$ gas supply source 53a supplies an $N_2$ gas as a carrier gas into the processing container 1 via a gas supply line 53b. In the gas supply line 53b, a flow rate controller 53c, a valve 53e and an orifice 53f are installed sequentially from the upstream side. On the downstream side of the orifice 53f, the gas supply line 53b is connected to the gas supply line 51b. The $N_2$ gas supplied from the $N_2$ gas supply source 53a is continuously supplied into the processing container 1 during the film formation on the wafer W. The supply and cutoff of the $N_2$ gas to be supplied from the $N_2$ gas supply source 53a to the processing container 1 are performed by the valve 53e. The gas is supplied to the gas supply line 51b at a relatively large flow rate by the storage tanks 51d and 52d. The gas supplied to the gas supply line 51b is prevented from flowing back to the gas supply line 53b by the orifice 53f.

The $B_2H_6$ gas supply source 55a supplies a $B_2H_6$ gas into the processing container 1 via a gas supply line 55b. In the gas supply line 55b, a flow rate controller 55c, a storage tank 55d and a valve 55e are installed sequentially from the upstream side. On the downstream side of the valve 55e, the gas supply line 55b is connected to the gas introduction hole 37. A $B_2H_6$ gas supplied from the $B_2H_6$ gas supply source 55a is temporarily stored in the storage tank 55d before being supplied into the processing container 1, pressurized to a predetermined pressure in the storage tank 55d, and then introduced into the processing container 1. The supply and cutoff of the $B_2H_6$ gas to be supplied from the storage tank 55d to the processing container 1 are performed by the valve 55e. By temporarily storing the $B_2H_6$ gas in the storage tank 55d in this manner, the $B_2H_6$ gas can be stably supplied into the processing container 1 at a relatively large flow rate.

The $N_2$ gas supply source 56a supplies an $N_2$ gas as a carrier gas into the processing container 1 via a gas supply line 56b. In the gas supply line 56b, a flow rate controller 56c, a storage tank 56d and a valve 56e are installed sequentially from the upstream side. On the downstream side of the valve 56e, the gas supply line 56b is connected to the gas supply line 55b. The $N_2$ gas supplied from the $N_2$ gas supply source 56a is temporarily stored in the storage tank 56d before being supplied into the processing container 1, pressurized to a predetermined pressure in the storage tank 56d, and then supplied into the processing container 1. The supply and cutoff of the $N_2$ gas to be supplied from the storage tank 56d to the processing container 1 is performed by the valve 56e. By temporarily storing the $N_2$ gas in the storage tank 56d in this manner, the $N_2$ gas can be stably supplied into the processing container 1 at a relatively large flow rate.

The $N_2$ gas supply source 57a supplies an $N_2$ gas as a carrier gas into the processing container 1 via a gas supply line 57b. In the gas supply line 57b, a flow rate controller 57c, a valve 57e and an orifice 57f are installed sequentially from the upstream side. On the downstream side of the orifice 57f, the gas supply line 57b is connected to the gas supply line 55b. The $N_2$ gas supplied from the $N_2$ gas supply source 57a is continuously supplied into the processing container 1 during the film formation on the wafer W. The supply and cutoff of the $N_2$ gas to be supplied from the $N_2$ gas supply source 57a to the processing container 1 are performed by the valve 57e. The gas is supplied to the gas supply line 55b at a relatively large flow rate by the storage tanks 55d and 56d. The gas supplied to the gas supply line 55b is prevented from flowing back to the gas supply line 57b by the orifice 57f.

The operation of the first film-forming apparatus 101 configured as described above is generally controlled by the control part 6. The control part 6 is, for example, a computer, and includes a CPU (Central Processing Unit), a RAM (Random Access Memory), a ROM (Read Only Memory), an auxiliary storage device, and the like. The CPU operates based on a program stored in the ROM or the auxiliary storage device, and controls the overall operation of the apparatus. The control part 6 may be provided inside the first film-forming apparatus 101 or may be provided outside the first film-forming apparatus 101. When the control part 6 is provided outside the first film-forming apparatus 101, the control part 6 can control the first film-forming apparatus 101 by a wire or wireless communication means.

Figure 3:
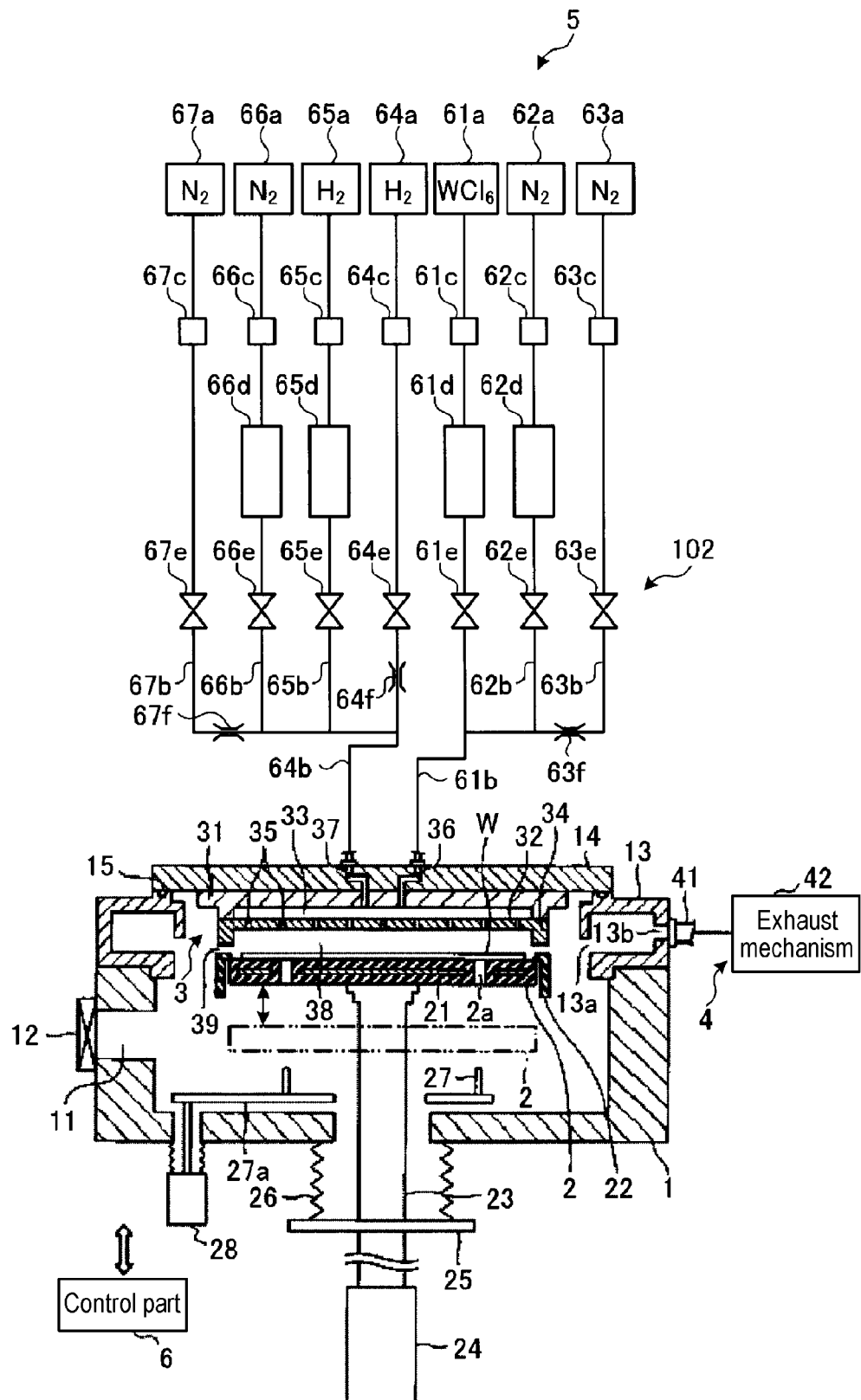
FIG. 3 is showing an example of a schematic configuration of a second film-forming apparatus according to an embodiment of the present disclosure.

Next, the configuration of the second film-forming apparatus 102 will be described. FIG. 3 is a sectional view showing an example of the schematic configuration of the second film-forming apparatus according to the embodiment. The second film-forming apparatus 102 has the same configuration as the first film-forming apparatus 101 except for the gas to be used and the gas supply mechanism 5 for supplying the gas. The parts of the second film-forming apparatus 102 which are the same as those of the first film-forming apparatus 101 are denoted by like reference numerals, and a description thereof will be omitted. Different points will be mainly described.

The gas supply mechanism 5 is connected to gas introduction holes 36 and 37, and is capable of supplying various gases used for film formation. In the present embodiment, a tungsten chloride gas and a hydrogen gas are supplied from the gas supply mechanism 5 to form an initial tungsten film on the wafer W. In the present embodiment, a case where a $WCl_6$ gas is used as tungsten chloride gas is described by way of example. However, a $WCl_5$ gas may be used. Further, the gas used for forming the initial tungsten film is not limited to the combination of the tungsten chloride gas and the hydrogen gas. For example, depending on process conditions such as a temperature, a pressure and the like, the initial tungsten film may be formed by only the tungsten chloride gas.

For example, the gas supply mechanism 5 includes a $WCl_6$ gas supply source 61a, an $N_2$ gas supply source 62a, an $N_2$ gas supply source 63a, a $H_2$ gas supply source 64a, a $H_2$ gas supply source 65a, an $N_2$ gas supply source 66a, and an $N_2$ gas supply source 67a as a gas supply source of a gas for forming the initial tungsten film. Even in the gas supply mechanism 5 shown in FIG. 3, the respective gas supply sources are separately shown. However, the gas supply sources capable of being used in common may be used in common.

The $WCl_6$ gas supply source 61a supplies a $WCl_6$ gas into the processing container 1 via a gas supply line 61b. In the gas supply line 61b, a flow rate controller 61c, a storage tank 61d and a valve 61e are installed sequentially from the upstream side. On the downstream side of the valve 61e, the gas supply line 61b is connected to the gas introduction hole 36. The $WCl_6$ gas supplied from the $WCl_6$ gas supply source 61a is temporarily stored in the storage tank 61d before being supplied into the processing container 1, pressurized to a predetermined pressure in the storage tank 61d, and then supplied into the processing container 1. The supply and cutoff of the $WCl_6$ gas to be supplied from the storage tank 61d to the processing container 1 is performed by the valve 61e. By temporarily storing the $WCl_6$ gas in the storage tank 61d in this way, the gas supply mechanism 5 can stably supply the $WCl_6$ gas into the processing container 1 at a relatively large flow rate.

The $N_2$ gas supply source 62a supplies an $N_2$ gas as a purge gas into the processing container 1 via a gas supply line 62b. In the gas supply line 62b, a flow rate controller 62c, a storage tank 62d and a valve 62e are installed sequentially from the upstream side. On the downstream side of the valve 62e, the gas supply line 62b is connected to the gas supply line 61b. The $N_2$ gas supplied from the $N_2$ gas supply source 62a is temporarily stored in the storage tank 62d before being supplied into the processing container 1, pressurized to a predetermined pressure in the storage tank 62d, and then supplied into the processing container 1. The supply and cutoff of the $N_2$ gas to be supplied from the storage tank 62d to the processing container 1 is performed by the valve 62e. By temporarily storing the $N_2$ gas in the storage tank 62d in this way, the gas supply mechanism 5 can stably supply the $N_2$ gas into the processing container 1 at a relatively large flow rate.

The $N_2$ gas supply source 63a supplies an $N_2$ gas as a carrier gas into the processing container 1 via a gas supply line 63b. In the gas supply line 63b, a flow rate controller 63c, a valve 63e and an orifice 63f are installed sequentially from the upstream side. On the downstream side of the orifice 63f, the gas supply line 63b is connected to the gas supply line 61b. The $N_2$ gas supplied from the $N_2$ gas supply source 63a is continuously supplied into the processing container 1 during the film formation on the wafer W. The supply and cutoff of the $N_2$ gas to be supplied from the $N_2$ gas supply source 63a to the processing container 1 are performed by the valve 63e. The gas is supplied to the gas supply lines 61b and 62b at a relatively large flow rate by the storage tanks 61d and 62d. The gas supplied to the gas supply lines 61b and 62b is prevented from flowing back to the gas supply line 63b by the orifice 63f.

The $H_2$ gas supply source 64a supplies a $H_2$ gas as a reducing gas into the processing container 1 via a gas supply line 64b. In the gas supply line 64b, a flow rate controller 64c, a valve 64e and an orifice 64f are installed sequentially from the upstream side. On the downstream side of the orifice 64f, the gas supply line 64b is connected to the gas introduction hole 37. The $H_2$ gas supplied from the $H_2$ gas supply source 64a is continuously supplied into the processing container 1 during the film formation on the wafer W. The supply and cutoff of the $H_2$ gas to be supplied from the $H_2$ gas supply source 64a to the processing container 1 are performed by the valve 64e. The gas is supplied to the gas supply lines 65b and 66b at a relatively large flow rate by the storage tanks 65d and 66d which will be described later. The gas supplied to the gas supply lines 65b and 66b is prevented from flowing back into the gas supply line 64b by the orifice 64f.

The $H_2$ gas supply source 65a supplies a $H_2$ gas as a reducing gas into the processing container 1 via a gas supply line 65b. In the gas supply line 65b, a flow rate controller 65c, a storage tank 65d and a valve 65e are installed sequentially from the upstream side. On the downstream side of the valve 65e, the gas supply line 65b is connected to the gas supply line 64b. The $H_2$ gas supplied from the $H_2$ gas supply source 65a is temporarily stored in the storage tank 65d before being supplied into the processing container 1, pressurized to a predetermined pressure in the storage tank 65d, and then supplied into the processing container 1. The supply and cutoff of the $H_2$ gas to be supplied from the storage tank 65d to the processing container 1 is performed by the valve 65e. By temporarily storing the $H_2$ gas in the storage tank 65d in this way, the gas supply mechanism 5 can stably supply the $H_2$ gas into the processing container 1 at a relatively large flow rate.

The $N_2$ gas supply source 66a supplies an $N_2$ gas as a purge gas into the processing container 1 via a gas supply line 66b. In the gas supply line 66b, a flow rate controller 66c, a storage tank 66d and a valve 66e are installed sequentially from the upstream side. On the downstream side of the valve 66e, the gas supply line 66b is connected to the gas supply line 64b. The $N_2$ gas supplied from the $N_2$ gas supply source 66a is temporarily stored in the storage tank 66d before being supplied into the processing container 1, pressurized to a predetermined pressure in the storage tank 66d, and then supplied into the processing container 1. The supply and cutoff of the $N_2$ gas to be supplied from the storage tank 66d to the processing container 1 are performed by the valve 66e. By temporarily storing the $N_2$ gas in the storage tank 66d in this manner, the gas supply mechanism 5 can stably supply the $N_2$ gas into the processing container 1 at a relatively large flow rate.

The $N_2$ gas supply source 67a supplies an $N_2$ gas as a carrier gas into the processing container 1 via a gas supply line 67b. In the gas supply line 67b, a flow rate controller 67c, a valve 67e and an orifice 67f are installed sequentially from the upstream side. On the downstream side of the orifice 67f, the gas supply line 67b is connected to the gas supply line 64b. The $N_2$ gas supplied from the $N_2$ gas supply source 67a is continuously supplied into the processing container 1 during the film formation on the wafer W. The supply and cutoff of the $N_2$ gas to be supplied from the $N_2$ gas supply source 67a to the processing container 1 are performed by the valve 67e. The gas is supplied to the gas supply lines 65b and 66b at a relatively large flow rate by the storage tanks 65d and 66d. The gas supplied to the gas supply lines 65b and 66b is prevented from flowing back to the gas supply line 67b by the orifice 67f.

[Film-Forming Method]

Figure 4:
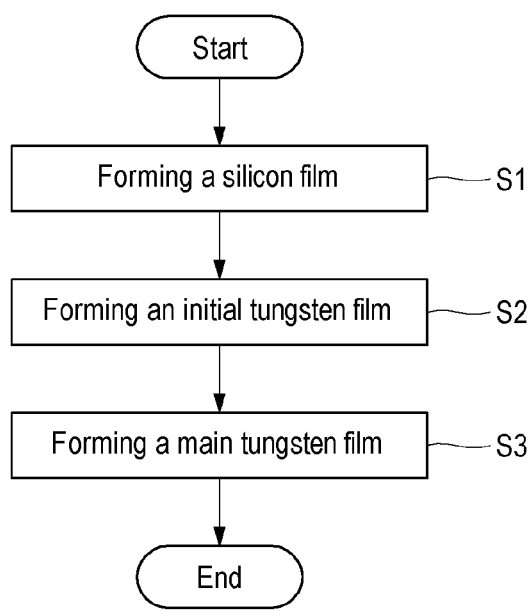
FIG. 4 is a flowchart showing an example of a flow of respective steps of a film-forming method according to an embodiment of the present disclosure.

Next, a tungsten film-forming method, which is performed using the film-forming system 100 configured as described above, will be described. FIG. 4 is a flowchart showing an example of the flow of respective steps of a film-forming method according to an embodiment. FIGS. 5A to 5D are sectional views schematically showing an example of the states of a wafer in the respective steps of the film-forming method according to the embodiment.

First, in the film-forming method according to the present embodiment, a wafer W (FIG. 5A) having an AlO film as a protective layer formed on the surface of a silicon film having a recess such as, for example, a trench or a hole, is prepared. In reality, a recess such as a trench or a hole (contact hole or via hole) is formed in the wafer W. However, for the sake of convenience, the recess is omitted in FIGS. 5A to 5D.

Figure 5A:
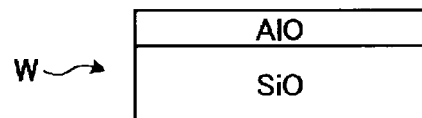
FIGS. 5A to 5D are sectional views schematically showing an example of the states of a wafer in the respective steps of the film-forming method according to an embodiment of the present disclosure.
Figure 5B:
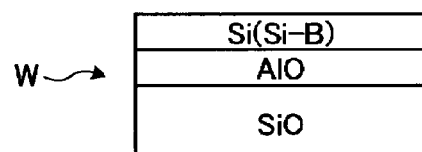

The first film-forming apparatus 101 forms a silicon film on the wafer W (step S1: FIG. 5B). For example, the first film-forming apparatus 101 alternately supplies a $SiH_4$ gas and a $B_2H_6$ gas into the processing container 1 to form a silicon film (Si (Si—B)). Details of the process of forming the silicon film will be described later.

Figure 5C:

The second film-forming apparatus 102 supplies a $WCl_6$ gas and a $H_2$ gas into the processing container 1 to form an initial tungsten film (Init. W) on the surface of the wafer W (step S2: FIG. 5C). Details of the process of forming the tungsten film will be described later.

Figure 5D:
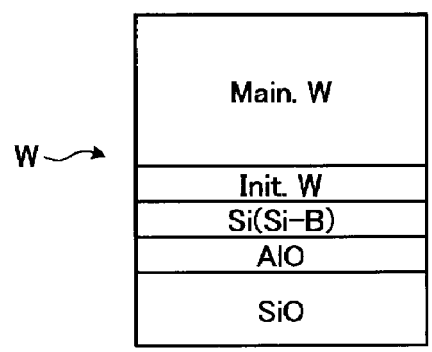

The third film-forming apparatus 103 supplies a tungsten-containing gas, for example, a $WF_6$ gas and a $H_2$ gas into the processing container 1 to form a main tungsten film (Main W) on the surface of the wafer W (step S3: FIG. 5D).

[Formation of Silicon Film]

Figure 6:
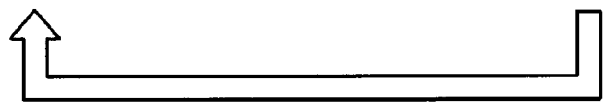
FIG. 6 is a diagram showing an example of a gas supply sequence at the time of forming a silicon film according to an embodiment of the present disclosure.

Next, the flow of forming the silicon film by the first film-forming apparatus 101 will be described. FIG. 6 is a diagram showing an example of a gas supply sequence at the time of forming the silicon film according to the embodiment.

The control part 6 of the first film-forming apparatus 101 controls the heater 21 of the mounting table 2 to heat the wafer W to a predetermined temperature (for example, 250 to 550 degrees C.). Further, the control part 6 controls the pressure control valve of the exhaust mechanism 42 to regulate the pressure in the processing container 1 to a predetermined pressure (for example, $1.0 \times 10^1$ to $1.0 \times 10^4$ Pa).

The control part 6 opens the valves 53e and 57e and supplies a carrier gas ($N_2$ gas) at a predetermined flow rate (for example, 100 to 10000 sccm) from the $N_2$ gas supply sources 53a and 57a into the processing container 1 via the gas supply lines 53b and 57b, respectively. In parallel with the supply of the carrier gas ($N_2$ gas) into the processing container 1, the control part 6 supplies a $SiH_4$ gas and a $B_2H_6$ gas from the $SiH_4$ gas supply source 51a and the $B_2H_6$ gas supply source 55a to the gas supply line 51b and 55b. Since the valves 51e and 55e are closed, the $SiH_4$ gas and the $B_2H_6$ gas are respectively stored in the storage tanks 51d and 55d, and the pressure in the storage tanks 51d and 55d is increased. Further, the control part 6 supplies an $N_2$ gas from the $N_2$ gas supply source 52a and the $N_2$ gas supply source 56a to the gas supply lines 52b and 56b, respectively. Since the valves 52e and 56e are closed, the $N_2$ gas is stored in the storage tanks 52d and 56d, respectively, and the pressure in the storage tanks 52d and 56d is increased.

The control part 6 opens the valve 51e and supplies the $SiH_4$ gas stored in the storage tank 51d into the processing container 1 (step S11).

After a predetermined time (for example, 0.05 to 20 seconds) has elapsed since the opening of the valve 51e, the control part 6 closes the valve 51e and stops the supply of the $SiH_4$ gas into the processing container 1. In addition, the control part 6 stops the supply of the $SiH_4$ gas, opens the valves 52e and 56e, and supplies the $N_2$ gas stored in the storage tanks 52d and 56d into the processing container 1 (step S12). At this time, since the purge gas is supplied from the storage tanks 52d and 56d having an increased pressure, the purge gas is supplied into the processing container 1 at a relatively large flow rate, for example, a flow rate (for example, 500 to 10000 sccm) larger than the flow rate of the carrier gas. Therefore, the $SiH_4$ gas remaining in the processing container 1 is promptly discharged to the exhaust pipe 41, and the inside of the processing container 1 is changed from the $SiH_4$ gas atmosphere to the atmosphere containing the $N_2$ gas in a short time. On the other hand, as the valve 51e is closed, the $SiH_4$ gas supplied from the $SiH_4$ gas supply source 51a to the gas supply line 51b is stored in the storage tank 51d, and the pressure in the storage tank 51d is increased.

After a predetermined time (for example, 0.05 to 20 seconds) has elapsed since the opening of the valves 52e and 56e, the control part 6 closes the valves 52e and 56e and stops the supply of the $N_2$ gas from the gas supply line 52b and the gas supply line 56b into the processing container 1. In addition, the control part 6 stops the supply of the $N_2$ gas, opens the valve 55e, and supplies the $B_2H_6$ gas stored in the storage tank 55d into the processing container 1 (step S13). As a result, silicon is deposited on the wafer W. As the valve 52e is closed, the N₂ gas supplied from the N₂ gas supply source 52a to the gas supply line 52b is stored in the storage tank 52d, and the pressure in the storage tank 52d is increased. Furthermore, as the valve 56e is closed, the N₂ gas supplied from the N₂ gas supply source 56a to the gas supply line 56b is stored in the storage tank 56d, and the pressure in the storage tank 56d is increased.

After a predetermined time (for example, 0.05 to 20 seconds) has elapsed since the opening of the valve 55e, the control part 6 closes the valve 55e and stops the supply of the B₂H₆ gas into the processing container 1. In addition, the control part 6 stops the supply of the B₂H₆ gas, opens the valves 52e and 56e, and supplies the N₂ gas stored in the storage tanks 52d and 56d into the processing container 1 (step S14). At this time, since the purge gas is supplied from the storage tanks 52d and 56d having an increased pressure, the purge gas is supplied into the processing container 1 at a relatively large flow rate, for example, a flow rate (for example, 500 to 10000 sccm) larger than the flow rate of the carrier gas. Therefore, the B₂H₆ gas remaining in the processing container 1 is promptly discharged to the exhaust pipe 41, and the inside of the processing container 1 is changed from the B₂H₆ gas atmosphere to the atmosphere containing the N₂ gas in a short time. On the other hand, as the valve 55e is closed, the B₂H₆ gas supplied from the B₂H₆ gas supply source 55a to the gas supply line 556 is stored in the storage tank 55d, and the pressure in the storage tank 55d is increased.

After a predetermined time (for example, 0.05 to 20 seconds) has elapsed since the opening of the valves 52e and 56e, the control part 6 closes the valves 52e and 56e and stops the supply of the N₂ gas from the gas supply line 52b and the gas supply line 56b into the processing container 1. As the valve 52e is closed, the N₂ gas supplied from the N₂ gas supply source 52a to the gas supply line 52b is stored in the storage tank 52d, and the pressure in the storage tank 52d is increased. Furthermore, as the valve 56e is closed, the N₂ gas supplied from the N₂ gas supply source 56a to the gas supply line 56b is stored in the storage tank 56d, and the pressure in the storage tank 56d is increased.

The control part 6 forms a silicon film having a desired film thickness by repeating the cycle of steps S11 to S14 for a plurality of cycles (for example, 10 to 1000 cycles).

The gas supply sequence and the process gas conditions at the time of forming the silicon film shown in FIG. 6 are nothing more than examples, and the present disclosure is not limited thereto. The silicon film may be formed by using other gas supply sequences and other process gas conditions.

[Formation of Initial Tungsten Film]

Figure 7:
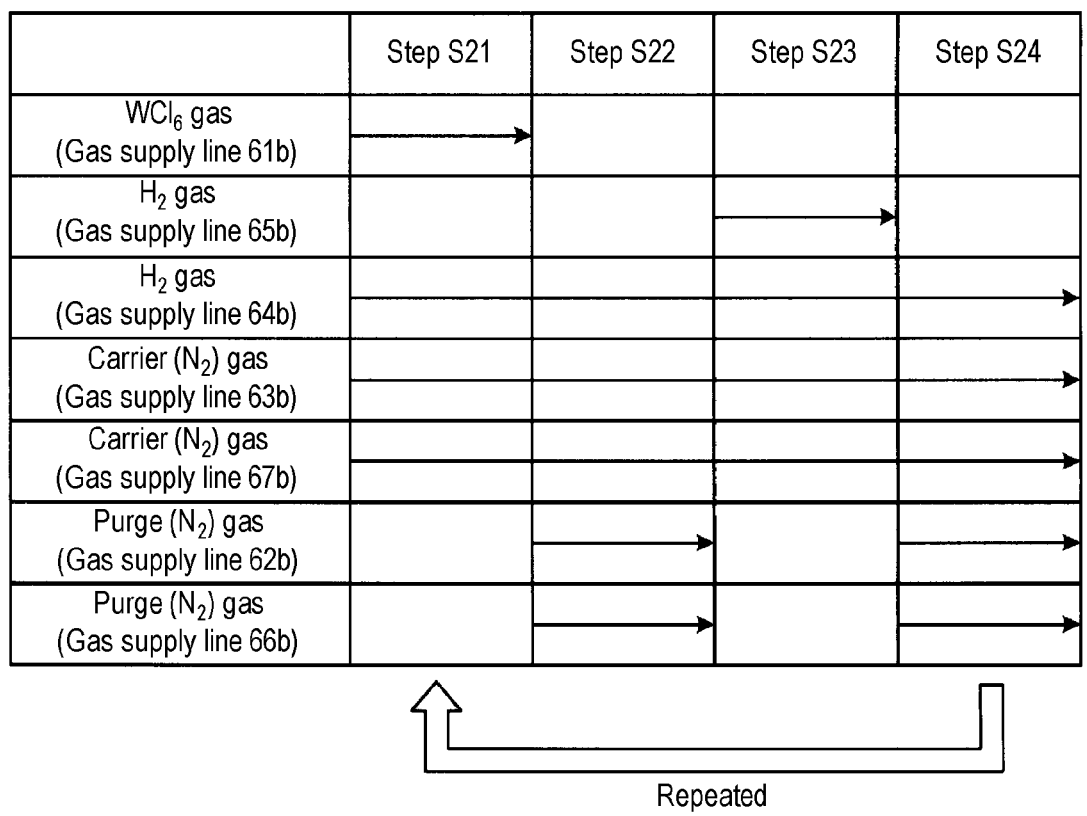
FIG. 7 is a diagram showing an example of a gas supply sequence at the time of forming an initial tungsten film according to an embodiment of the present disclosure.

Next, a flow of forming an initial tungsten film by the second film-forming apparatus 102 will be described. FIG. 7 is a diagram showing an example of a gas supply sequence at the time of forming an initial tungsten film according to an embodiment.

The control part 6 of the second film-forming apparatus 102 controls the heater 21 of the mounting table 2 to heat the wafer W to a predetermined temperature (for example, 250 to 650 degrees C.). Further, the control part 6 controls the pressure control valve of the exhaust mechanism 42 to adjust the pressure in the processing container 1 to a predetermined pressure (for example, $1.3 \times 10^1$ to $8.0 \times 10^3$ Pa).

The control part 6 opens the valves 63e and 67e and supplies a carrier gas (N₂ gas) at a predetermined flow rate (for example, 100 to 3000 sccm) from the N₂ gas supply sources 63a and 67a to the gas supply lines 63b and 67b, respectively. Further, the control part 6 opens the valve 64e and supplies a H₂ gas at a predetermined flow rate (for example, 500 to 30000 sccm) from the H₂ gas supply source 64a to the gas supply line 64b. Moreover, the control part 6 supplies a WCl₆ gas and a H₂ gas from the WCl₆ gas supply source 61a and the H₂ gas supply source 65a, respectively, to the gas supply lines 61b and 65b. At this time, since the valves 61e and 65e are closed, the WCl₆ gas and the H₂ gas are respectively stored in the storage tanks 61d and 65d, and the pressure in the storage tanks 61d and 65d is increased.

Next, the control part 6 opens the valve 61e, supplies the WCl₆ gas stored in the storage tank 61d into the processing container 1 as a precursor, and causes the WCl₆ gas to be adsorbed on the surface of the wafer W (step S21). In parallel with the supply of the WCl₆ gas into the processing container 1, the control part 6 supplies a purge gas (N₂ gas) from the N₂ gas supply sources 62a and 66a to the gas supply lines 62b and 66b, respectively. At this time, by closing the valves 62e and 66e, the purge gas is stored in the storage tanks 62d and 66d, and the pressure in the storage tanks 62d and 66d is increased.

After a predetermined time (for example, 0.05 to 5 seconds) has elapsed since the opening of the valve 61e, the control part 6 closes the valve 61e. Furthermore, the control part 6 closes the valve 61e and opens the valves 62e and 66e to stop the supply of the WCl₆ gas into the processing container 1 and to supply the purge gas stored in the storage tanks 62d and 66d into the processing container 1 (step S22). At this time, since the purge gas is supplied from the storage tanks 62d and 66d having an increased pressure, the purge gas is supplied into the processing container 1 at a relatively large flow rate, for example, a flow rate (for example, 500 to 10000 sccm) larger than the flow rate of the carrier gas. Therefore, the WCl₆ gas remaining in the processing container 1 is promptly discharged to the exhaust pipe 41, and the inside of the processing container 1 is changed from the WCl₆ gas atmosphere to the atmosphere containing the H₂ gas and the N₂ gas in a short time. On the other hand, as the valve 61e is closed, the WCl₆ gas supplied from the WCl₆ gas supply source 61a to the gas supply line 61b is stored in the storage tank 61d, and the pressure in the storage tank 61d is increased.

After a predetermined time (for example, 0.05 to 5 seconds) has elapsed since the opening of the valves 62e and 66e, the control part 6 closes the valves 62e and 66e, opens the valve 65e, and stops the supply of the purge gas into the processing container 1. In addition, the control part 6 stops the supply of the purge gas, supplies the H₂ gas stored in the storage tank 65d into the processing container 1, and reduces the WCl₆ gas adsorbed on the surface of the wafer W (step S23). At this time, due to the closing of the valves 62e and 66e, the purge gas supplied from the N₂ gas supply sources 62a and 66a to the gas supply lines 62b and 66b, respectively, is stored in the storage tanks 62d and 66d, and the pressure in the storage tanks 62d and 66d is increased.

After a predetermined time (for example, 0.05 to 5 seconds) has elapsed since the opening of the valve 65e, the control part 6 closes the valve 65e, opens the valves 62e and 66e, and stops the supply of the H₂ gas into the processing container 1. Furthermore, the control part 6 stops the supply of the H₂ gas and supplies the purge gas stored in the storage tanks 62d and 66d into the processing container 1 (step S24). At this time, since the purge gas is supplied from the storage tanks 62d and 66d having an increased pressure, the purge gas is supplied into the processing container 1 at a relatively large flow rate, for example, a flow rate (for example, 500 to 10000 sccm) larger than the flow rate of the carrier gas. Thus, the H₂ gas remaining in the processing container 1 is promptly discharged to the exhaust pipe 41, and the inside of the processing container 1 is changed from the H$_2$ gas atmosphere to the atmosphere containing the H$_2$ gas and the N$_2$ gas in a short time. On the other hand, as the valve 65e is closed, the H$_2$ gas supplied from the H$_2$ gas supply source 65a to the gas supply line 65b is stored in the storage tank 65d, and the pressure in the storage tank 65d is increased.

The control part 6 forms an initial tungsten film having a desired film thickness by repeating the cycle of steps S21 to S24 for a plurality of cycles (for example, 50 to 2000 cycles).

The gas supply sequence and the process gas conditions at the time of forming the initial tungsten film shown in FIG. 7 are nothing more than examples, and the present disclosure is not limited thereto. The tungsten film may be formed by using other gas supply sequences and other process gas conditions.

[Action and Effect]

Figure 8:
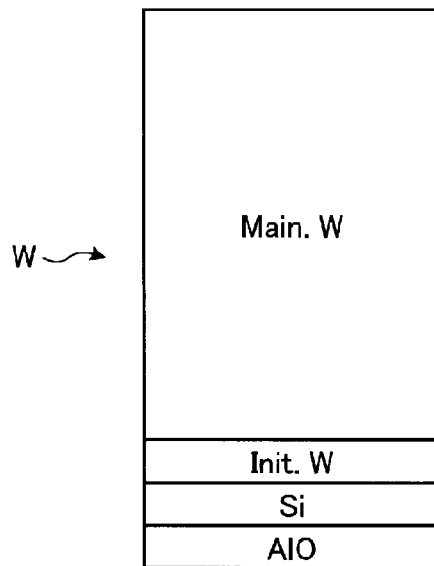
FIG. 8 is a diagram showing an example of a layer configuration of a wafer according to an embodiment of the present disclosure.

Next, the actions and effects of the film-forming method according to the present embodiment will be described. FIG. 8 is a diagram showing an example of the layer configuration of the wafer according to the present embodiment. FIG. 8 shows an example of the layer configuration of the wafer W on which films are formed by the film-forming method according to the present embodiment. In the wafer W, an AlO layer as a protective layer is formed on a silicon (SiO$_2$) layer, and a silicon film (Si) is formed on the AlO layer from the viewpoint of adhesion and reaction suppression. In the wafer W, an initial tungsten film (Init. W) is formed on the silicon film, and a main tungsten film (Main W) is formed on the initial tungsten film, whereby a low-resistance tungsten film is formed.

One example of the process conditions of the film-forming method according to the embodiment will now be summarized below.

Silicon Film
Temperature: 250 to 550 degrees C.
Pressure: 1 to 100 Torr
SiH$_4$: 100 to 1000 sccm
B$_2$H$_6$ gas: 100 to 1000 sccm
Carrier gas (N$_2$): 100 to 10000 sccm
Purge gas (N$_2$): 500 to 30000 sccm
Time:
SiH$_4$ gas: 0.05 to 20 seconds
Purge: 0.05 to 20 seconds
B$_2$H$_6$ gas: 0.05 to 20 seconds
Purge: 0.05 to 20 seconds
Initial tungsten film
Temperature: 400 to 650 degrees C.
Pressure: 1 to 60 Torr
WCl$_6$ gas: 50 to 1500 mg/min
Carrier gas (N$_2$): 100 to 3000 sccm
Purge gas (N$_2$): 500 to 10000 sccm
H$_2$ gas: 500 to 30000 sccm
Time:
WCl$_6$ gas: 0.05 to 5 seconds
Purge: 0.05 to 5 seconds
H$_2$ gas: 0.05 to 5 seconds
Purge: 0.05 to 5 seconds
Main tungsten film
Temperature: 250 to 550 degrees C.
Pressure: 0.1 to 20 Torr
WF$_6$ gas: 100 to 500 sccm
Carrier gas (N$_2$): 500 to 10000 sccm
Purge gas (N$_2$): 0 to 10000 sccm
H$_2$ gas: 500 to 20000 sccm
Time:
WF$_6$ gas: 0.05 to 15 seconds
Purge: 0.05 to 15 seconds
H$_2$ gas: 0.05 to 15 seconds
Purge: 0.05 to 15 seconds A tungsten film can be formed on the wafer W by forming a silicon film before depositing tungsten. The silicon film may have a thickness of about 0.5 to 3 nm in some embodiments. Further, the initial tungsten film may have a thickness of about 0.5 to 6 nm. As a result, in the wafer W, grains of tungsten to be deposited can be caused to grow large and the resistance of the tungsten film can be reduced.

Figure 9:
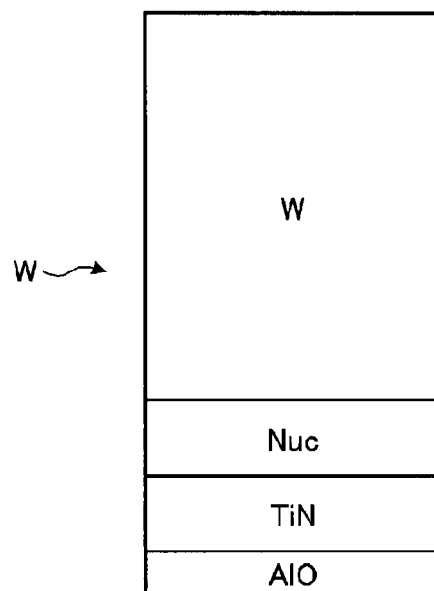
FIG. 9 is a diagram showing an example of a layer configuration of a wafer according to a comparative example.

The effects will be described using a comparative example. FIG. 9 is a diagram showing an example of a layer configuration of a wafer according to a comparative example. FIG. 9 shows an example of a layer configuration of a conventional wafer W. In the wafer W, an AlO layer as a protective layer is formed on a silicon (SiO$_2$) layer, and a TiN film having a thickness of, for example, 2 nm is formed on the AlO layer from the viewpoint of adhesion and reaction suppression. Then, in the wafer W, a nucleation step is performed and a tungsten nucleation film (Nuc) having a thickness of, for example, 3 nm is formed on the TiN film. Then, in the wafer W, a low-resistance tungsten film (W) is formed on the nucleation film.

An example of the process conditions for forming each film of the comparative example will be described below.

Figure 10:
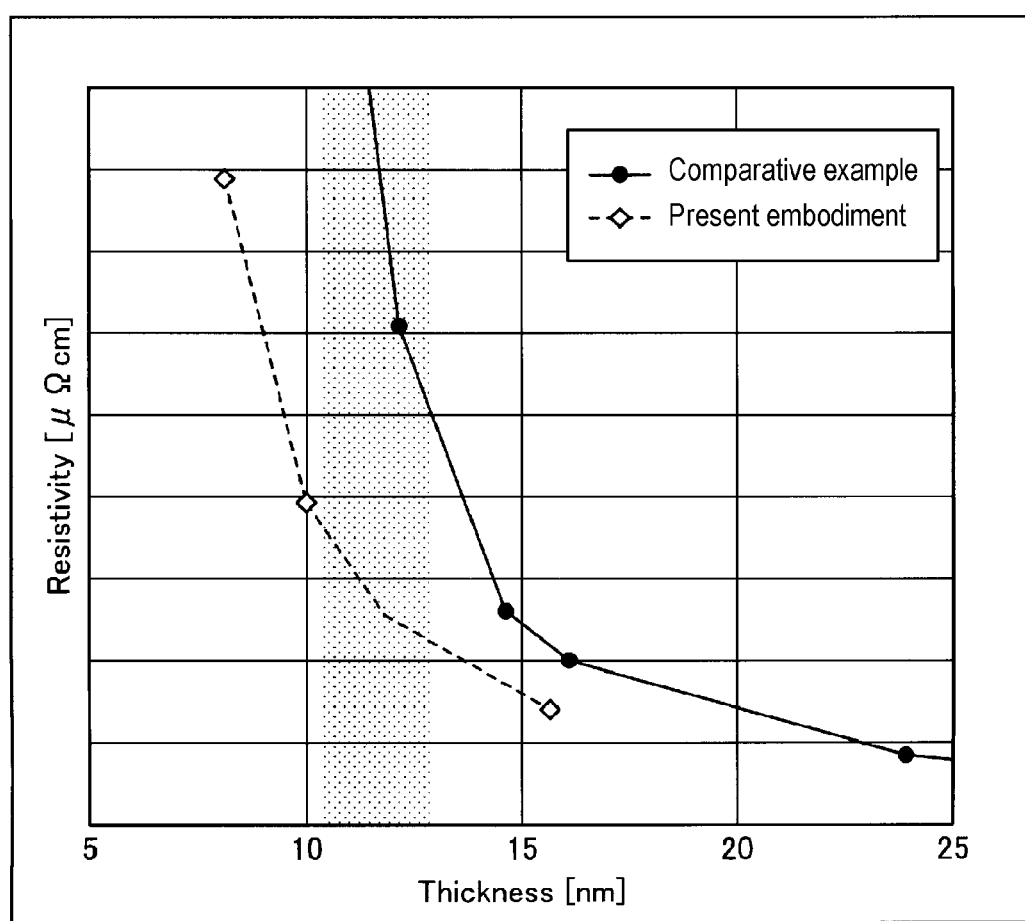
FIG. 10 is a diagram showing an example of a change in resistivity with respect to a thickness of a tungsten film.

Nucleation film
Temperature: 250 to 550 degrees C.
Pressure: 1 to 100 Torr
WF$_6$ gas: 10 to 500 sccm
Carrier gas (N$_2$): 500 to 10000 sccm
Purge gas (N$_2$): 0 to 10000 sccm
H$_2$ gas: 500 to 20000 sccm
SiH$_4$ gas: 10 to 1000 sccm
Time:
WF$_6$ gas: 0.05 to 15 seconds
Purge: 0.05 to 15 seconds
SiH$_4$ gas: 0.05 to 15 seconds
Purge: 0.05 to 15 seconds
Tungsten film
Temperature: 250 to 550 degrees C.
Pressure: 0.1 to 20 Torr
WF$_6$ gas: 100 to 500 sccm
Carrier gas (N$_2$): 1000 to 10000 sccm
Purge gas (N$_2$): 0 to 10000 sccm
H$_2$ gas: 500 to 20000 sccm
Time:
WF$_6$ gas: 0.05 to 15 seconds
Purge: 0.05 to 15 seconds
H$_2$ gas: 0.05 to 15 seconds
Purge: 0.05 to 15 seconds FIG. 10 is a diagram showing an example of a change in resistivity with respect to the thickness of the tungsten film. FIG. 10 shows a change in resistivity depending on the thickness of the tungsten film in the layer configuration of the present embodiment shown in FIG. 8 and the layer configuration of the comparative example shown in FIG. 9. In the example of FIG. 10, the thickness of the tungsten film is measured from the interface with the AlO layer. That is, in the layer configuration of the present embodiment, the thickness of the silicon film (Si), the initial tungsten film (Init. W) and the main tungsten film (Main W) is regarded as the thickness of the tungsten film. In the layer configuration of the comparative example, the thickness of the TiN film, the nucleation film (Nuc) and the tungsten film (W) is regarded as the thickness of the tungsten film. In the example of FIG. 10, there is shown the resistivity normalized with reference to the resistivity of the comparative example when the thickness is 10 nm. As shown in FIG. 10, the resistivity of the layer configuration of the present embodiment is lower than that of the comparative example.

Conventionally, when forming a tungsten film on a wafer W, as shown in FIG. 9, a TiN film is formed as a barrier layer on a silicon layer of the wafer W, and a nucleation film is formed on the TiN film. Then, in the wafer W, a tungsten film (W) is formed on the nucleation film. Conventionally, when forming the tungsten film on the wafer W, the thickness corresponding to the TiN film is also required. In addition, the nucleation film has a high resistance. As the tungsten film is formed thinner, the resistance grows higher. Therefore, in the case of reducing the thickness of the entire tungsten film, the tungsten film has a high resistance due to the influence of the TiN film and the nucleation film.

In the LSI, the wiring is miniaturized, and the reduction in the resistance of the wiring is required. For example, in a three-dimensional stacked semiconductor memory such as a 3D NAND flash memory or the like, a tungsten film is formed as a word line. For the sake of miniaturization, it is required to further reduce the resistance of the tungsten film.

On the other hand, in the layer configuration of the present embodiment, it is possible to reduce the resistance of the tungsten film even when the thickness of the tungsten film is made small for the purpose of miniaturization.

In this embodiment, there has been described the case where the initial tungsten film is formed by the combination of the tungsten chloride gas and the hydrogen gas. However, the present disclosure is not limited thereto. For example, in the second film-forming apparatus 102, the initial tungsten film may be formed by using only the tungsten chloride gas without using the hydrogen gas. For example, the second film-forming apparatus 102 may intermittently supply only tungsten chloride to form an initial tungsten film. As the tungsten chloride gas, for example, a $WCl_6$ gas or a $WCl_5$ gas may be used. Process conditions for forming the initial tungsten film with the tungsten chloride gas are as follows.

Tungsten film
Temperature: 400 to 650 degrees C.
Pressure: 1 to 600 Torr
Tungsten chloride gas ($WCl_5$ or $WCl_6$): 50 to 1500 mg min
Carrier gas ($N_2$): 500 to 3000 sccm
Purge gas ($N_2$): 1000 to 10000 sccm
Time:
Tungsten chloride gas ($WCl_5$ or $WCl_6$): 0.05 to 300 seconds Furthermore, in the present embodiment, there has been described the case where the silicon film and the initial tungsten film are formed by separate film-forming apparatuses.

Figure 11:
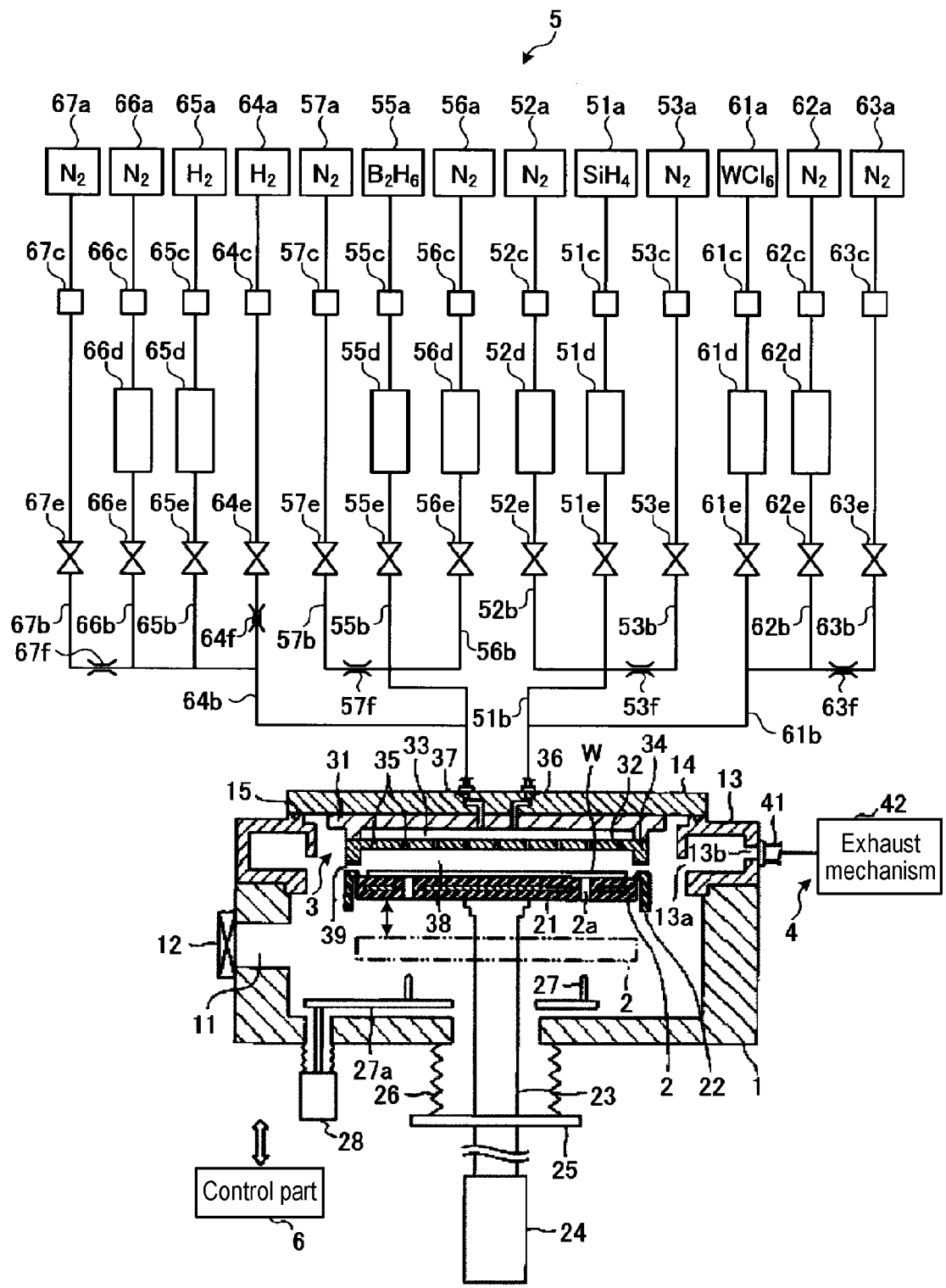
FIG. 11 is a sectional view showing another example of the schematic configuration of the film-forming apparatus according to an embodiment of the present disclosure.

However, the present disclosure is not limited thereto. For example, as shown in FIG. 11, the silicon film, the initial tungsten film and the main tungsten film may be formed by a single film-forming apparatus including a gas supply mechanism for forming a silicon film and a gas supply mechanism for forming a tungsten film. Further, the wafer W may be transferred through the respective film-forming apparatuses under the atmospheric pressure.

As described above, in the tungsten film-forming method according to the present embodiment, the wafer W having a protective film, for example, an AlO film formed thereon is disposed in the processing container 1, and the silicon film is formed on the wafer W in a reduced pressure atmosphere. In the tungsten film-forming method, the initial tungsten film is formed by supplying the tungsten chloride gas to the wafer W having the silicon film formed thereon. In the tungsten film-forming method, the main tungsten film is formed by supplying the tungsten-containing gas onto the initial tungsten film. This makes it possible to reduce the resistance of the tungsten film.

Furthermore, in the method of forming the initial tungsten film among the tungsten films according to the present embodiment, the tungsten film is formed by alternately supplying the tungsten chloride gas and the hydrogen gas. This makes it possible to quickly form the tungsten film.

Moreover, in the tungsten film-forming method according to the present embodiment, the silicon film is formed by alternately supplying the $SiH_4$ gas and the $B_2H_6$ gas. This makes it possible to improve the adhesion of the silicon film to the wafer W.

In addition, in the tungsten film-forming method according to the present embodiment, the film thickness of the silicon film is set to 0.5 to 3 nm. This makes it possible to stably form the tungsten film.

Although the embodiment has been described above, various modifications may be made without being limited to the above-described embodiment. For example, although a semiconductor wafer has been described as an example of a substrate, the semiconductor wafer may be silicon, or a compound semiconductor such as GaAs, SiC, GaN or the like.

Furthermore, the substrate is not limited to the semiconductor wafer, but may be a glass substrate used for an FPD (flat panel display) such as a liquid crystal display device or the like, a ceramic substrate, and the like.

According to the present disclosure, it is possible to reduce the resistance of a tungsten film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A tungsten film-forming method, comprising:
    forming a silicon film on a substrate in a reduced pressure atmosphere by disposing the substrate having a protective film formed on a surface of the substrate in a processing container;
    forming an initial tungsten film on the silicon film by supplying a tungsten chloride gas to the substrate having the silicon film formed thereon; and
    forming a main tungsten film on the initial tungsten film by supplying a tungsten-containing gas to the substrate having the silicon film and the initial tungsten film formed thereon,
    wherein in the forming a silicon film, the silicon film is formed by alternately supplying a $SiH_4$ gas and a $B_2H_6$ gas.

2. The method of claim 1, wherein in the forming an initial tungsten film, the initial tungsten film is formed by alternately supplying the tungsten chloride gas and a hydrogen gas.

3. The method of claim 1, wherein in the forming an initial tungsten film, the initial tungsten film is formed by supplying only the tungsten chloride gas without supplying a hydrogen gas.

4. The method of claim 3, wherein the tungsten chloride gas is intermittently supplied.

5. The method of claim 1, wherein the tungsten chloride gas is $WCl_5$ or $WCl_6$.

6. The method of claim 1, wherein the initial tungsten film has a thickness of 0.5 to 6 nm.

7. The method of claim 1, wherein the silicon film has a thickness of 0.5 to 3 nm.

8. The method of claim 1, wherein the forming a silicon film and the forming an initial tungsten film are performed in a same apparatus.

9. A storage medium operated on a computer and configured to store a program for controlling a film-forming apparatus, wherein when executed, the program causes the computer to control the film-forming apparatus so that the tungsten film-forming method of claim 1 is performed.

* * * * *